United States Patent
Faverzani et al.

(10) Patent No.: US 12,101,916 B2
(45) Date of Patent: Sep. 24, 2024

(54) COMPACT ELECTRONIC POWER CONVERTER TO CONTROL AT LEAST ONE ELECTRIC MOTOR OF A VEHICLE

(71) Applicant: FERRARI S.p.A., Modena (IT)

(72) Inventors: Paolo Faverzani, Modena (IT); Ugo Sitta, Modena (IT); Giovanni Lo Calzo, Modena (IT); Christian Montebello, Modena (IT); Alessandro Di Blasio, Modena (IT)

(73) Assignee: FERRARI S.P.A., Modena (IT)

( * ) Notice: Subject to any disclaimer, the term of this patent is extended or adjusted under 35 U.S.C. 154(b) by 246 days.

(21) Appl. No.: 17/748,334

(22) Filed: May 19, 2022

(65) Prior Publication Data
US 2022/0386516 A1 Dec. 1, 2022

(30) Foreign Application Priority Data

May 26, 2021 (IT) .......................... 102021000013676

(51) Int. Cl.
*H05K 7/20* (2006.01)
*B60L 50/51* (2019.01)

(52) U.S. Cl.
CPC .......... *H05K 7/20927* (2013.01); *B60L 50/51* (2019.02); *H05K 7/20872* (2013.01); *B60L 2210/40* (2013.01)

(58) Field of Classification Search
CPC ............ H05K 7/20927; H05K 7/20872; B60L 50/51; B60L 2210/40
See application file for complete search history.

(56) References Cited

U.S. PATENT DOCUMENTS

| | | | |
|---|---|---|---|
| 5,469,331 A | 11/1995 | Conway et al. | |
| 2006/0119512 A1* | 6/2006 | Yoshimatsu | H01L 25/112 342/372 |
| 2009/0231811 A1* | 9/2009 | Tokuyama | H02M 7/537 361/699 |
| 2011/0051371 A1* | 3/2011 | Azuma | B60W 10/08 361/699 |
| 2014/0078803 A1* | 3/2014 | Nishihara | H02M 7/003 363/141 |
| 2015/0382501 A1* | 12/2015 | Horiuchi | H05K 7/2089 363/131 |
| 2017/0036563 A1* | 2/2017 | Degner | B60L 50/61 |
| 2018/0145605 A1 | 5/2018 | Park et al. | |
| 2018/0168075 A1* | 6/2018 | Okazaki | H05K 7/20927 |

(Continued)

OTHER PUBLICATIONS

Search Report for Italian Application No. 102021000013676, completed Jan. 31, 2022, 9 pages.

*Primary Examiner* — Rafael O Leon De Domenech
(74) *Attorney, Agent, or Firm* — CANTOR COLBURN LLP

(57) ABSTRACT

An electronic power converter to control at least one electric motor of a vehicle and having at least one group of power modules, each designed to power with an alternating current one single phase of the electric motor; two lateral plates, which are arranged on opposite sides of the group so as to form a pile; a hydraulic circuit, which is configured to cause a cooling liquid to circulate inside the plates; and a clamping system, which applies a clamping force to the pile in order to keep the pile compressed and has elastic elements, which are deformed in order to apply a compression force of elastic origin to the pile.

19 Claims, 16 Drawing Sheets

(56) References Cited

U.S. PATENT DOCUMENTS

| | | |
|---|---|---|
| 2018/0281605 A1* | 10/2018 | Sawazaki ................. B60K 6/52 |
| 2020/0022278 A1 | 1/2020 | Pradeepkumar et al. |
| 2020/0321884 A1 | 10/2020 | Deguchi et al. |
| 2020/0388559 A1 | 12/2020 | Maeda |

* cited by examiner

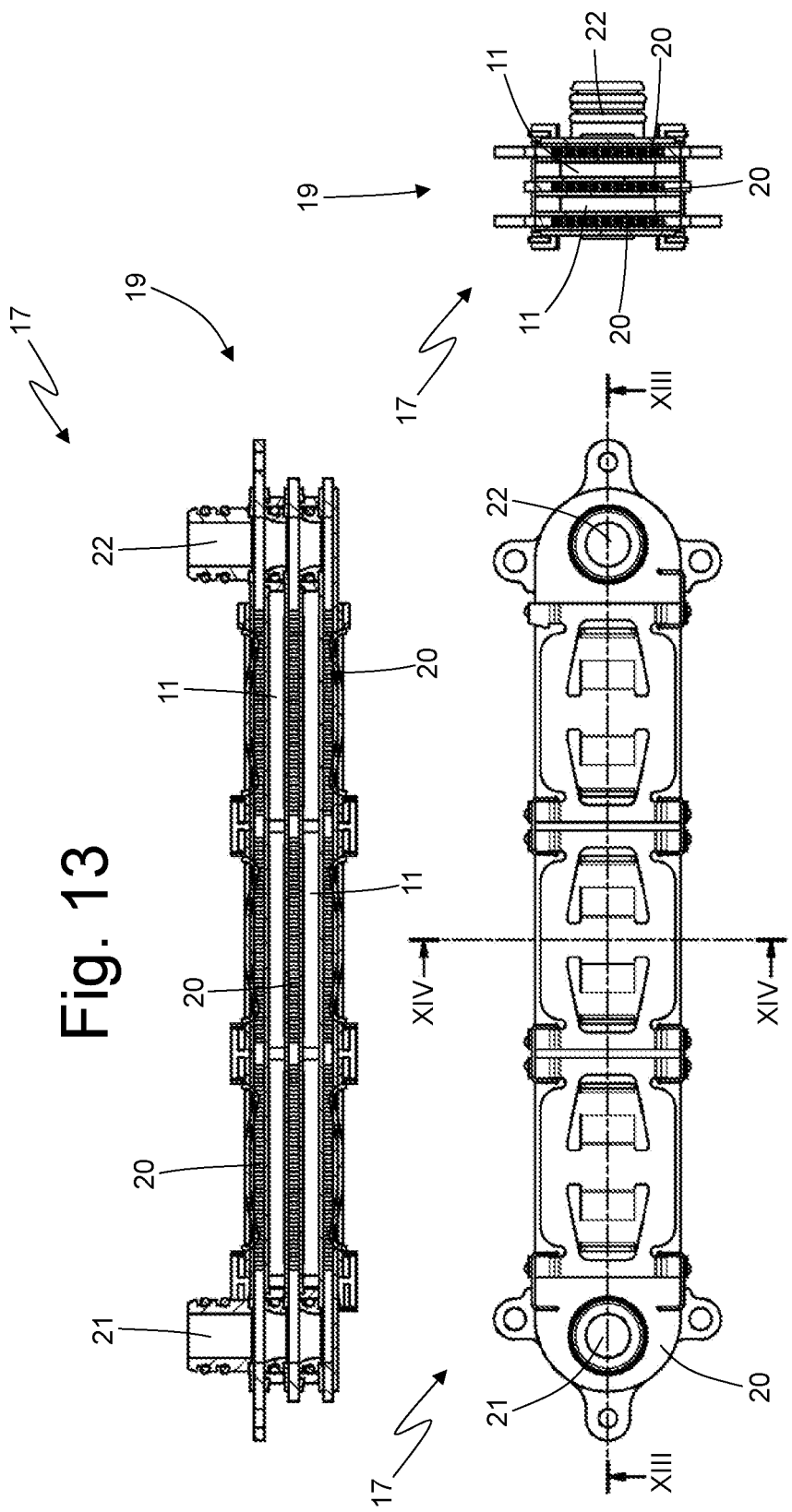

COMPACT ELECTRONIC POWER CONVERTER TO CONTROL AT LEAST ONE ELECTRIC MOTOR OF A VEHICLE

CROSS-REFERENCE TO RELATED APPLICATIONS

This patent application claims priority from Italian Patent Application No. 102021000013676 filed on May 26, 2021, the entire disclosure of which is incorporated herein by reference.

TECHNICAL FIELD

The invention relates to an electronic power converter to control at least one electric motor of a vehicle.

BACKGROUND ART

A vehicle can be provided with one single electric motor or with several electric motors (in which case, the drive is a full electric drive) or it can be provided with one or more electric motors combined with a combustion engine (in which case, the drive can be a full electric drive, a combustion drive or a hybrid drive).

The electric motor (or each electric motor) is mechanically connected to the drive wheels and is electrically connected to a power storage system through the interposition of an electronic power converter (namely, an "inverter"), which turns DC power (on the side connected to the storage system) into AC power (on the side connected to the electric motor) and vice versa.

Patent applications US2018145605A1, US2020321884A1 and US2020388559A1 as well as U.S. Pat. No. 5,469,331A describe an electronic power converter provided with a plurality of power modules piled on top of one another and provided with a liquid cooling.

DESCRIPTION OF THE INVENTION

The object of the invention is to provide an electronic power converter to control at least one electric motor of a vehicle, said electronic power converter being easily adjustable to the control of electric motors of different sizes, being compact and being, at the same time, easy and economic to be manufactured.

According to the invention, there is provided an electronic power converter to control at least one electric motor of a vehicle according to the appended claims.

The appended claims describe preferred embodiments of the invention and form an integral part of the description.

BRIEF DESCRIPTION OF THE DRAWINGS

The invention will now be described with reference to the accompanying drawings, which show some non-limiting embodiments thereof, wherein:

FIG. 12 is a plan view of the pile of components of FIGS. 10 and 11;

FIGS. 13 and 14 are two cross section views, along section lines XIII-XIII and XIV-XIV of the pile of components of FIGS. 10 and 11;

PREFERRED EMBODIMENTS OF THE INVENTION

Figure 1:
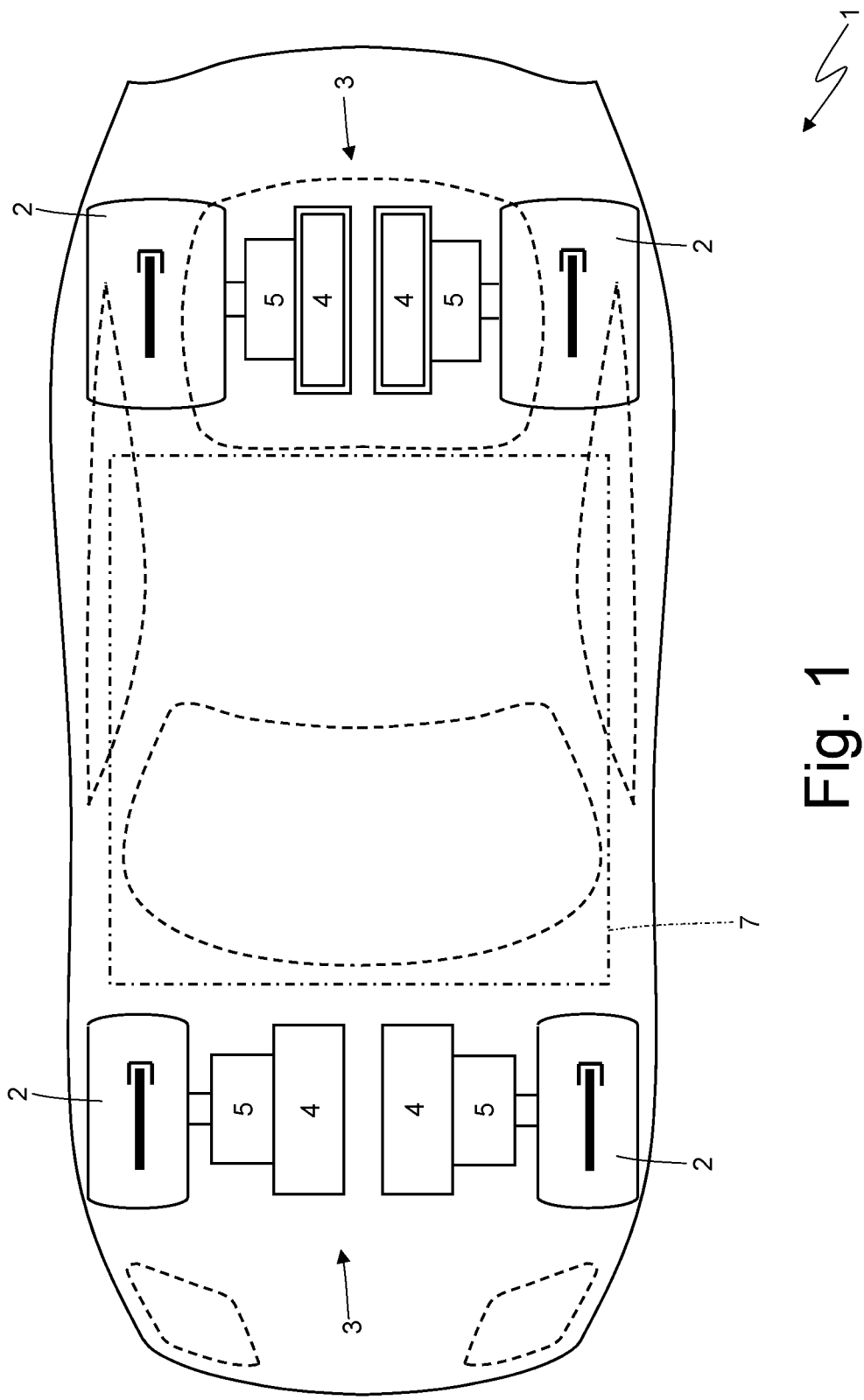
FIG. 1 is a schematic plan view of a road vehicle with electric drive.

In FIG. 1, number 1 indicates, as a whole, an electric drive vehicle provided with four drive wheels 2 (two front drive wheels 2 and two rear drive wheels 2).

The vehicle 1 comprises an electric powertrain system 3, which is arranged in a front position (namely, is connected to the two front drive wheels 2), and an electric powertrain system 3, which is arranged in a rear position (namely, is connected to the two rear drive wheels 2), is structurally identical to the electric powertrain system 3 arranged in a front position and is mechanically independent of and separate from the electric powertrain system 3 arranged in a front position.

According to a different embodiment which is not shown herein, the vehicle 1 comprises one single electric powertrain system 3 (arranged in a front position or arranged in a rear position) and, therefore, it only has two drive wheels 2; in this embodiment, the vehicle 1 could also comprise a combustion powertrain system connected to the drive wheels 2 that do not receive the motion from the electric powertrain system 3 and the combustion powertrain system could be provided with a further electric motor 4 connected to the drive shaft of an internal combustion engine.

Each electric powertrain system 3 comprises a pair of reversible electric motors 4 (i.e. which can work both as eclectic motor, absorbing electrical energy and generating a mechanical torque, and as electric generator, absorbing mechanical energy and generating electrical energy) provided with respective shafts and a pair of drivetrains 5, which connect the electric motors 4 (namely, the shafts of the electric motors 4) to the corresponding drive wheels 2 without the interposition of a clutch.

Figure 2:
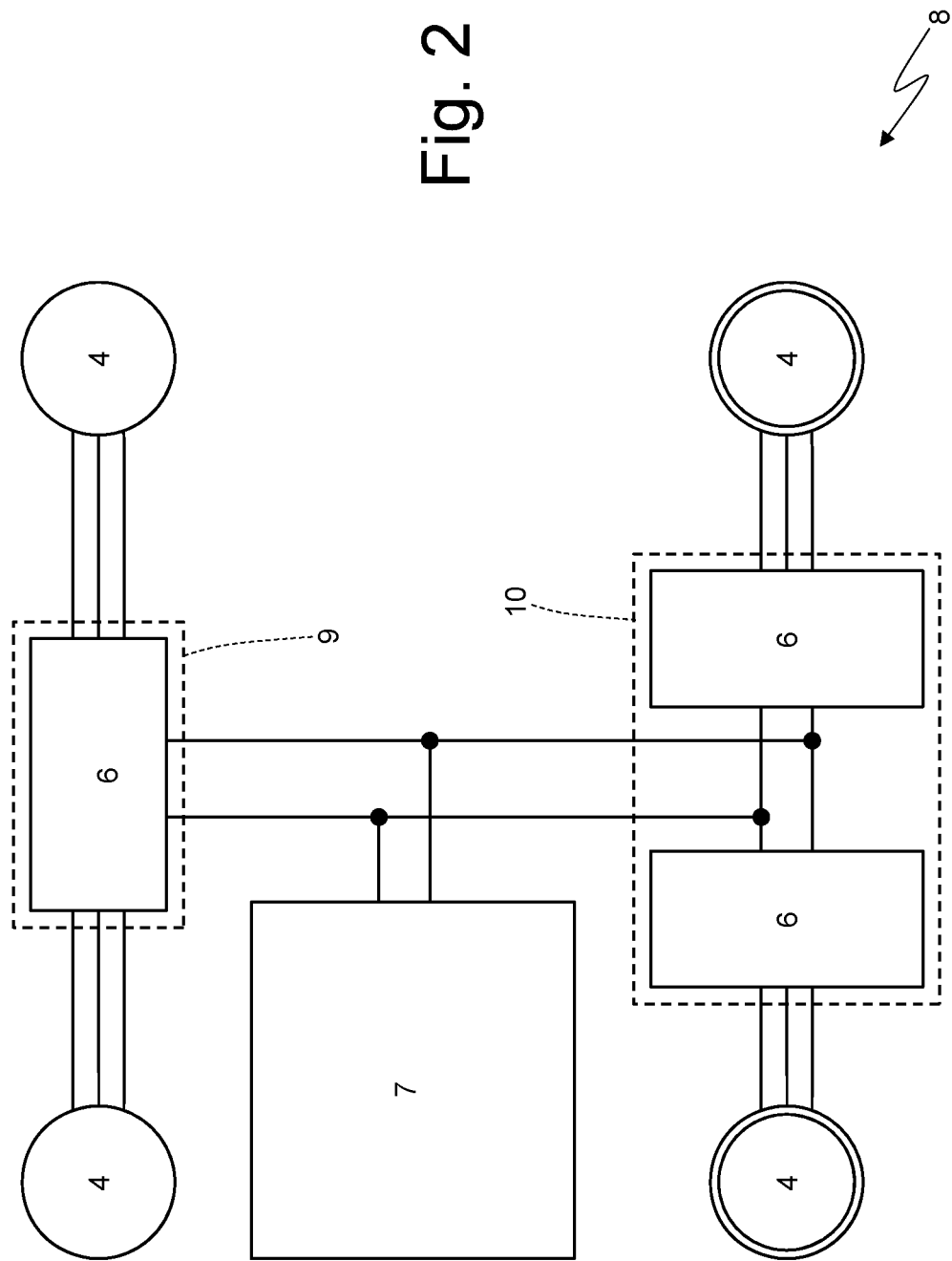
FIG. 2 is a schematic view of an high-voltage electric system of the vehicle of FIG. 1 provided with three electronic power converters according to the invention.

According to FIG. 2, each electric motor 4 is controlled by an AC/DC electronic power converter 6 (namely, an "inverter"), which is connected to a power storage system 7 provided with chemical batteries; namely, each electronic power converter 6 is a two-way converter and comprises a DC side, which is connected to the power storage system 7, and a three-phase AC side, which is connected to at least one electric motor 4.

As schematically shown in FIG. 1, the power storage system 7 has a flat and (relatively) thin conformation so that it can be integrated inside the floor of the vehicle 1.

According to FIG. 2, a high-voltage electric system of the vehicle 1 comprises three electronic power converters 6, which are structurally identical to one another: one single front electronic power converter 6 powers both front electric motors 4, whereas two rear electronic power converters 6 each power one single rear electric motor 4. Since the three electronic power converters 6 are structurally identical to one another, the front electric motors 4 evidently have a single nominal power (relative to the rear electric motors 4), whereas the rear electric motors 4 have a double nominal power (relative to the front electric motors 4); in other words, the rear electric motors 4 have a nominal power that is twice the one of the front electric motors 4, namely the front electric motors 4 have a nominal power that is half the one of the rear electric motors 4.

Figure 6:
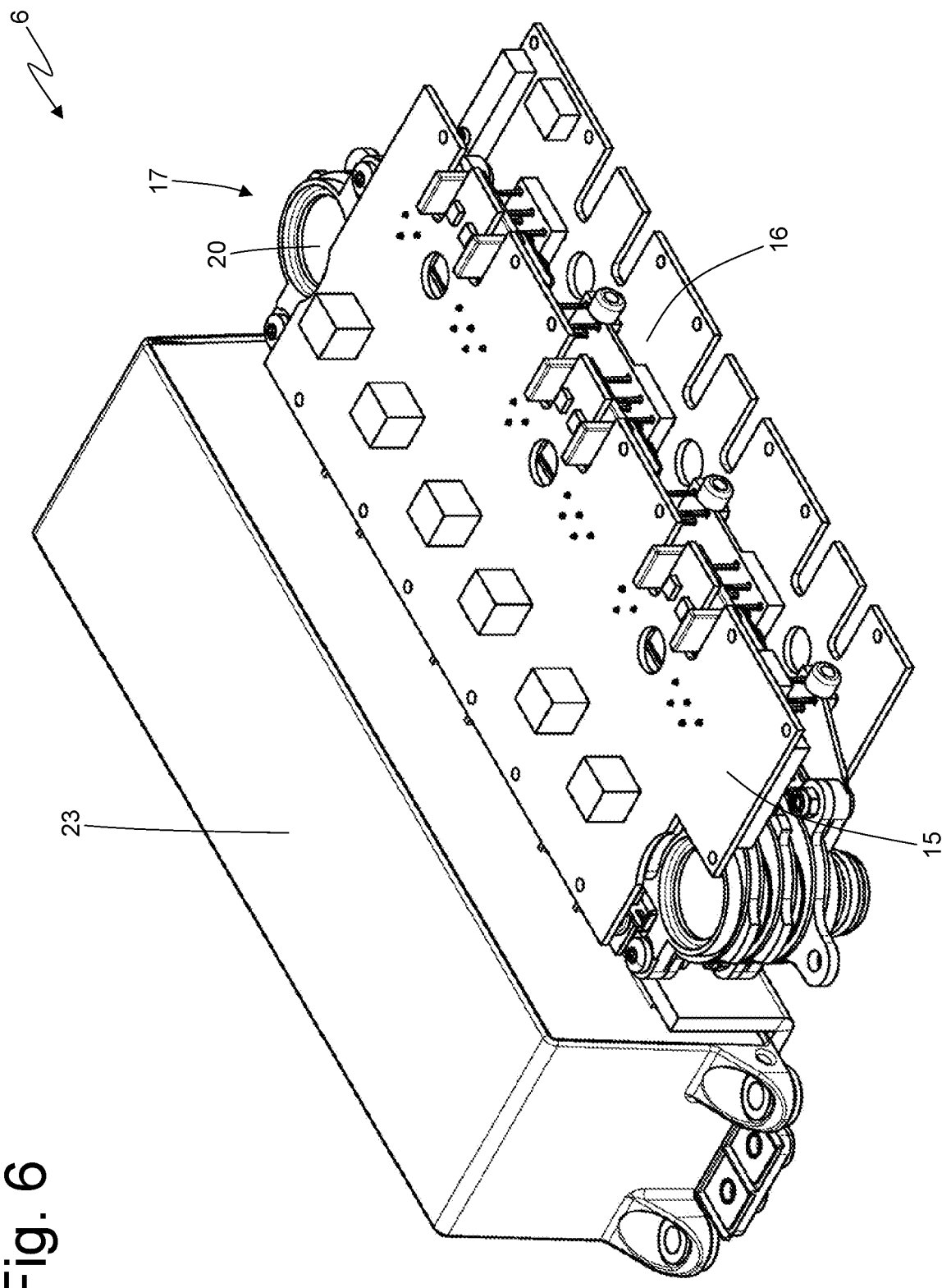
FIGS. 6 and 7 are two different perspective views, with parts removed for greater clarity, of the electronic power converter of FIG. 3.
Figure 8:
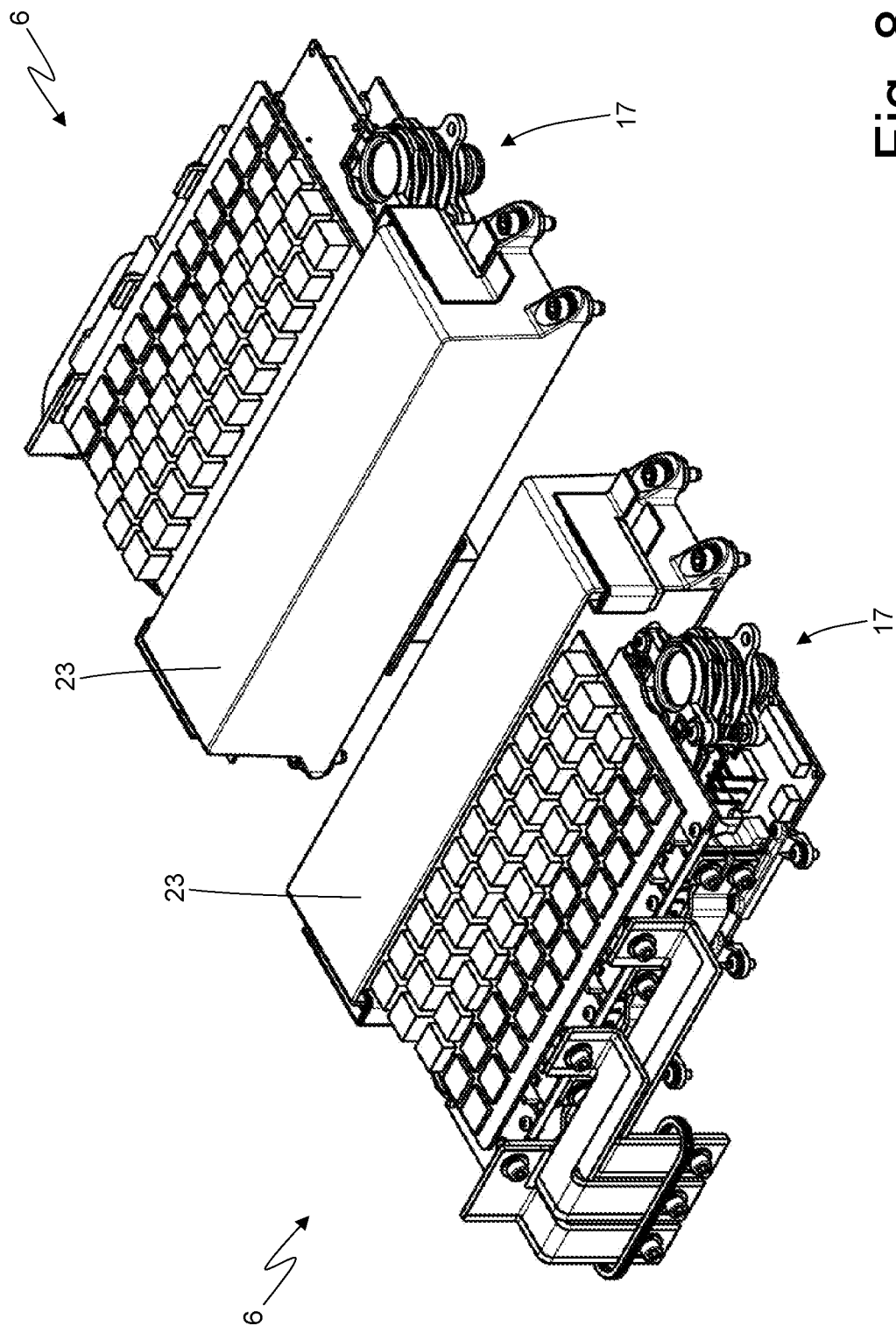
FIG. 8 is a perspective view, with parts removed for greater clarity, of a double electronic power converter.

Said single front electronic power converter 6 (shown more in detail in FIG. 6) is housed in a container 9, whereas the two rear electronic power converters 6 (shown more in detail in FIG. 8) are housed together in one single container 10.

Figure 3:
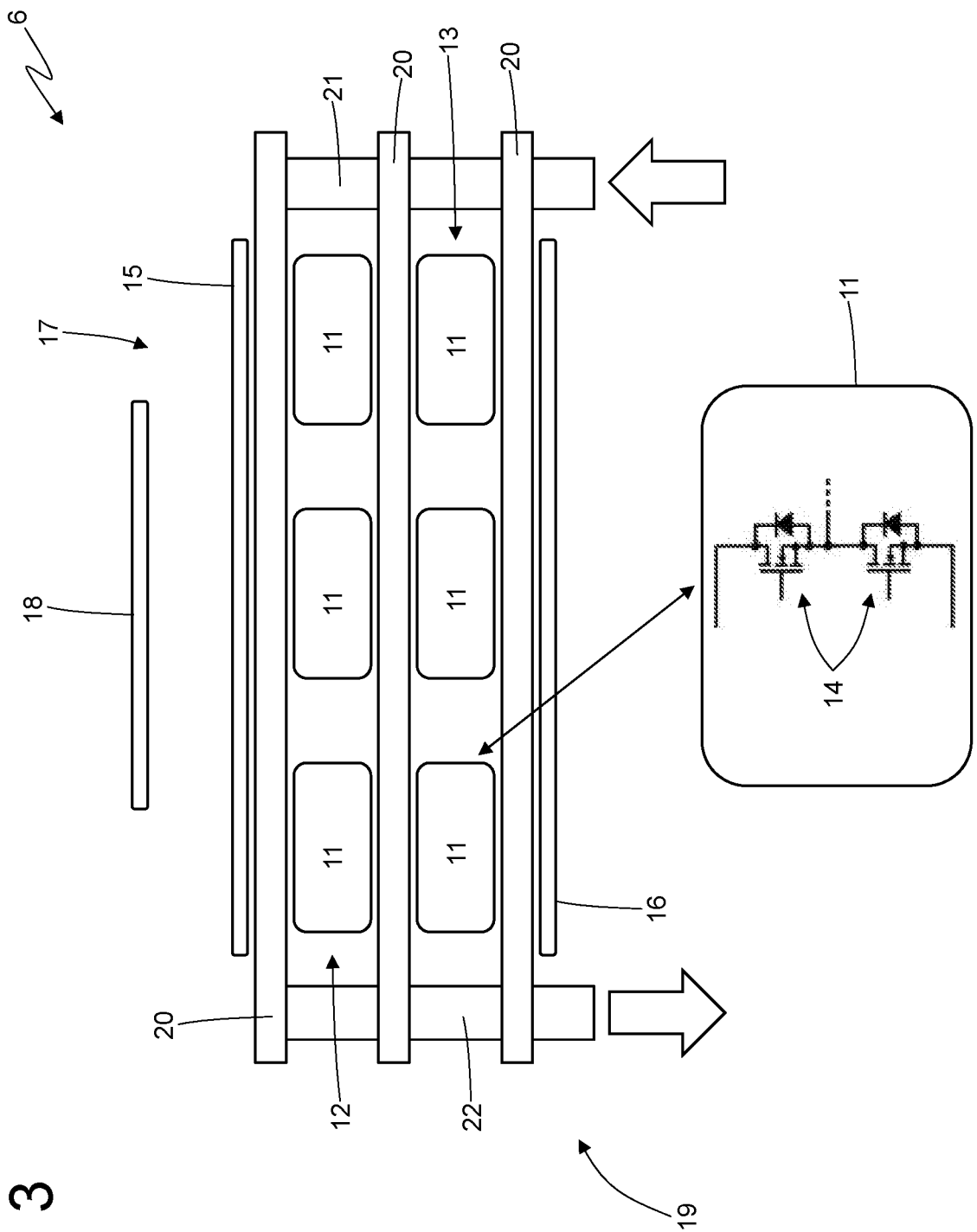
FIG. 3 is a schematic view of one single electronic power converter of the high-voltage electric system of FIG. 2.

According to FIG. 3, each electronic power converter 6 (both the front one and the rear ones) comprises six power modules 11, each designed to power with an alternating current one single phase of a corresponding electric motor 4; namely, each power module 11 represents one single "leg" of a three-phase inverter. In particular, the six power modules 11 are divided into a group 12 consisting of three power modules 11, which are arranged next to one another on a same plane, and a group 13 consisting of the other three power modules 11, which are arranged next to one another on a same plane, which is parallel to and separate from the plane of the group 12.

Each power module 11 is provided with respective transistors 14, each having a gate; obviously, the electric diagram of a power module 11 shown in FIG. 3 merely is a possible non-limiting example and, therefore, the power modules 11 could have any other electric diagram.

Each electronic power converter 6 comprises a gate control device 15, which is connected to the gates of the transistors 14 of the power modules 11 of the group 12, and a gate control device 16, which is separate from and independent of the gate control device 15 and is connected to the gates of the transistors 14 of the power modules 11 of the group 13. The gate control devices 15 and 16 also include current sensors, which measure the intensity of the alternating current flowing through the power modules 11.

The two groups 12 and 13 of power modules 11 are piled on top of one another so as to form one single compact pile 17; the two gate control devices 15 and 16 are on the outside of the pile 17, namely the gate control device 15 rests on the group 12 of power modules 11 on one side of the pile 17, whereas the gate control device 16 rests under the group 13 of power modules 11 on the other side of the pile 17.

Each electronic power converter 6 comprises a control unit 18, which controls the operation of the entire electronic power converter 6 and is directly connected to the two gate control devices 15 and 16. Namely, there is an electric (physical) connection between the control unit 18 and the two gate control devices 15 and 16 and there is a further electric (physical) connection between the two gate control devices 15 and 16 and the power modules 11. In each electronic power converter 6, the entire control logic is implemented in the control unit 18, which is the "brain" of the electronic power converter 6. The control unit 18 normally comprises an electronic circuit, which is provided with (at least) a microprocessor and is physically separate from the pile 17 (comprising the two groups 12 and 13 of power modules 11) and from the gate control devices 15 and 16.

Figure 4:
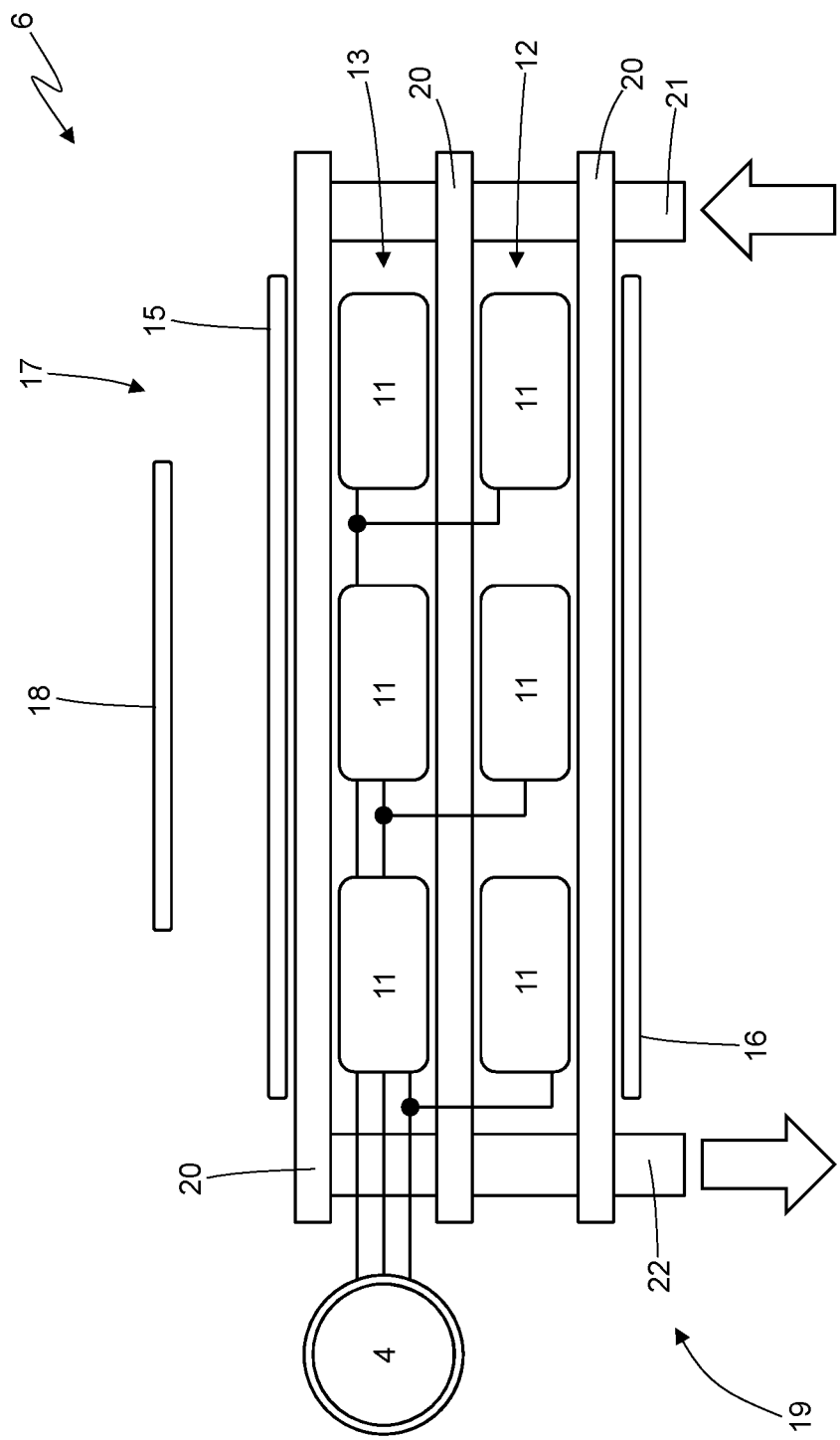
FIG. 4 is a schematic view of a rear electronic power converter of the high-voltage electric system of FIG. 2.
Figure 5:
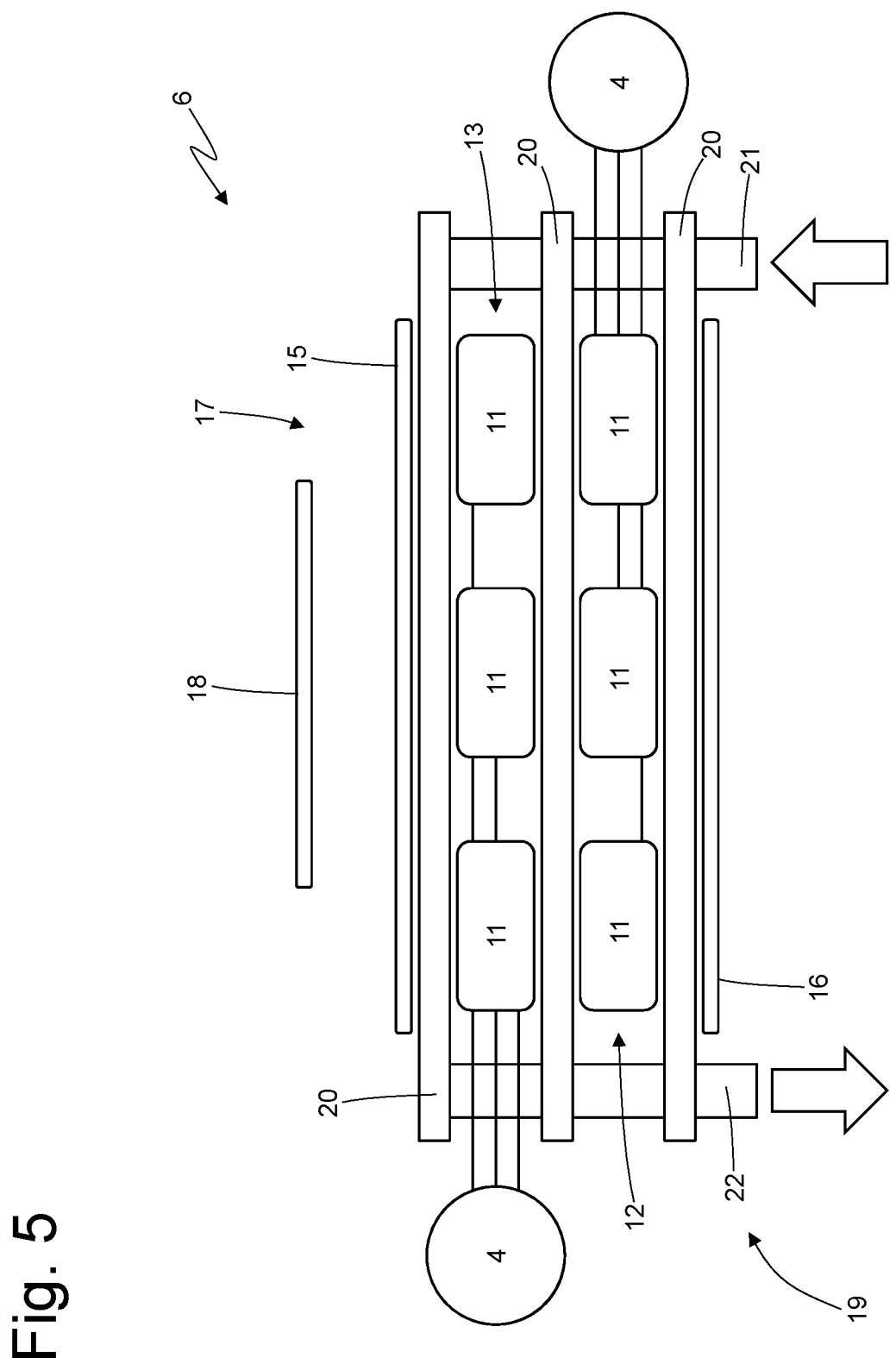
FIG. 5 is a schematic view of a front electronic power converter of the high-voltage electric system of FIG. 2.

The control unit 18 is configured to operate according to a first mode (shown in FIG. 4 and relating to the two rear electronic power converter 6), in which the electronic power converter 6 controls one single electric motor 4 with a double nominal power and each phase of the electric motor 4 is powered in parallel by a power module 11 of the group 12 and by a power module 11 of the group 13, or to operate according to a second mode (shown in FIG. 5 and relating to the front electronic power converter 6), in which two different electric motors 4 with a single nominal power are controlled and each power module 11 of the group 12 powers a corresponding phase of an electric motor 4 and each power module 11 of the group 13 powers a corresponding phase of the other electric motor 4.

Therefore, the same identical electronic power converter 6 can power one single electric motor 4 with a double nominal power (which is what happen in the rear axle) or can control two different electric motors 4 with a single nominal power (which is what happens in the front axle).

According to FIG. 3, each electronic power converter 6 comprises a cooling system 19 provided with three plates 20, which are interposed (inserted) in the pile 17; namely, the three plates 20 are part of the pile 17 and form the pile 17 together with the two groups 12 and 13 of power modules 11. The cooling system 19 is also provided with a hydraulic circuit configured to cause a cooling liquid to circulate inside the plates 20, namely to cause "cold" cooling liquid to flow into each plate 20 and to cause "hot" cooling liquid to flow out of each cooling plate 20. In particular, a central plate 20 is arranged between the two groups 12 and 13 of power modules 11, whereas the other two lateral plates 20 are arranged on the other sides of the groups 12 and 13 of power modules 11 (namely, between each group 12 or 13 and the corresponding gate control device 15 or 16); namely, the cooling system 19 comprises the central plate 20, which is interposed between the two groups 12 and 13 and two lateral plates 20 arranged at the two opposite ends of the two groups 12 and 13.

The hydraulic circuit comprises delivery pipe 21 (where the "cold" cooling liquid flows), which is oriented perpendicularly to the plates 20 and goes through two plates 20 from side to side, and a return pipe 22 (where the "hot" cooling liquid flows), which is oriented perpendicularly to the plates 20 and goes through two plates 20 from side to side.

Figure 7:
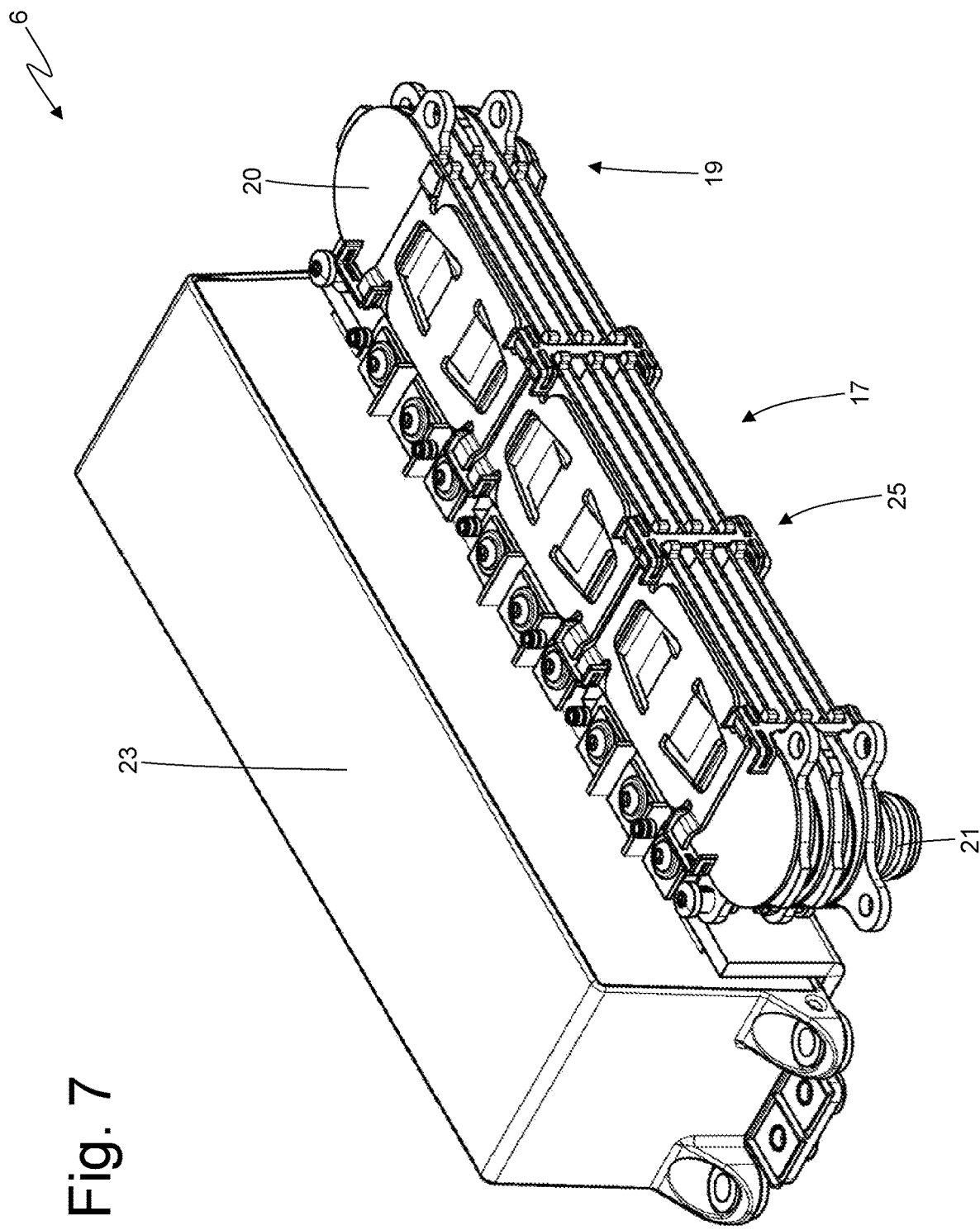

Each electronic power converter 6 comprises one single common DC input (schematically shown in FIG. 2), to which all six power modules 11 are connected in parallel, and one single common capacitor 23 (shown in FIGS. 6, 7 and 8), which is connected to the common input in parallel and is arranged next to the pile 17 (namely, next to the two groups 12 and 13 piled on top of one another).

Figure 11:
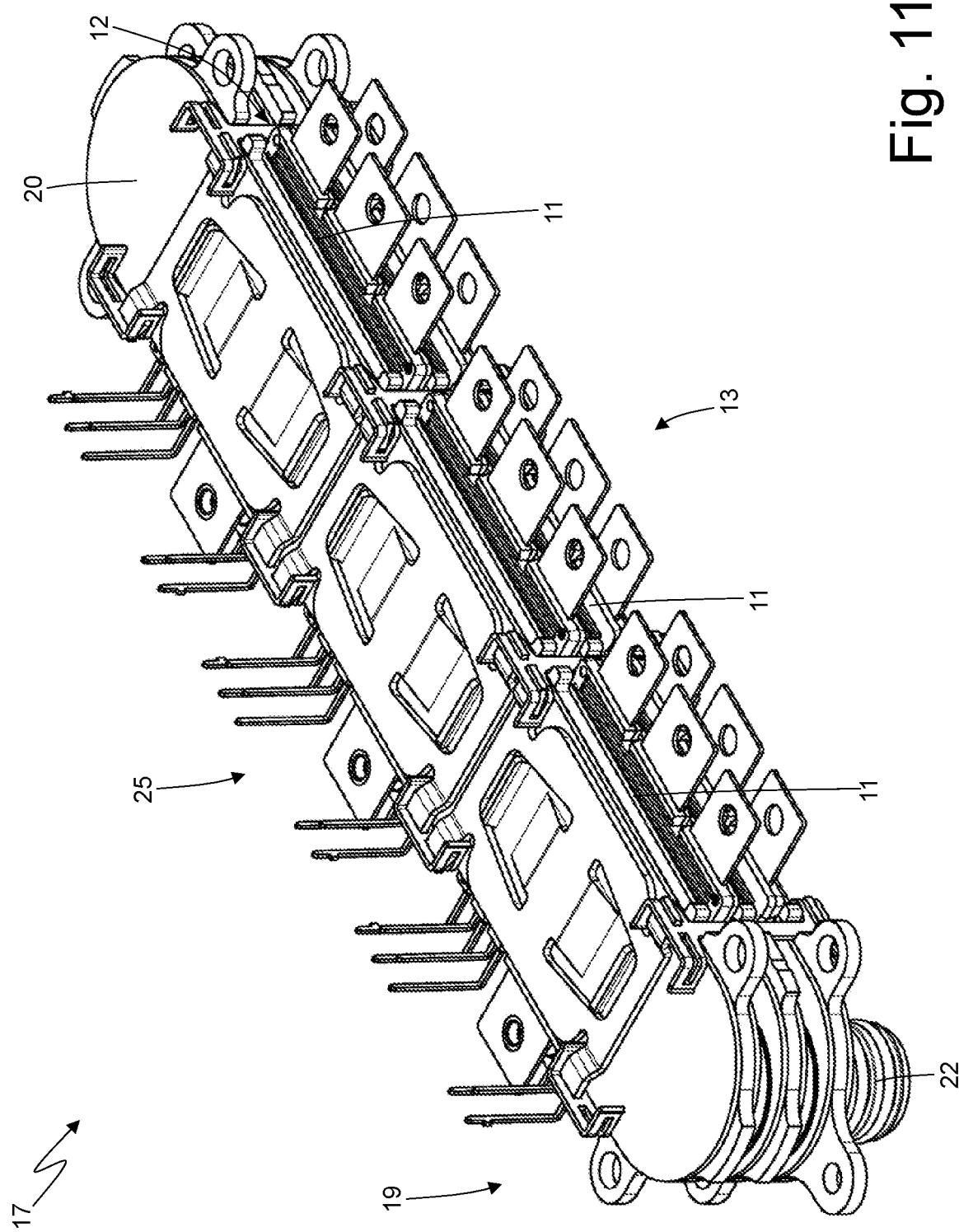

According to a preferred embodiment, the DC input comprises a positive bar, which has one single connection for each power module 11, and a negative bar, which has two different connections for each power module 11; namely, each power module 11 has one single connection to the positive bar, which is arranged in the middle of the two connection to the negative bar (as clearly shown in FIG. 11).

Figure 9:
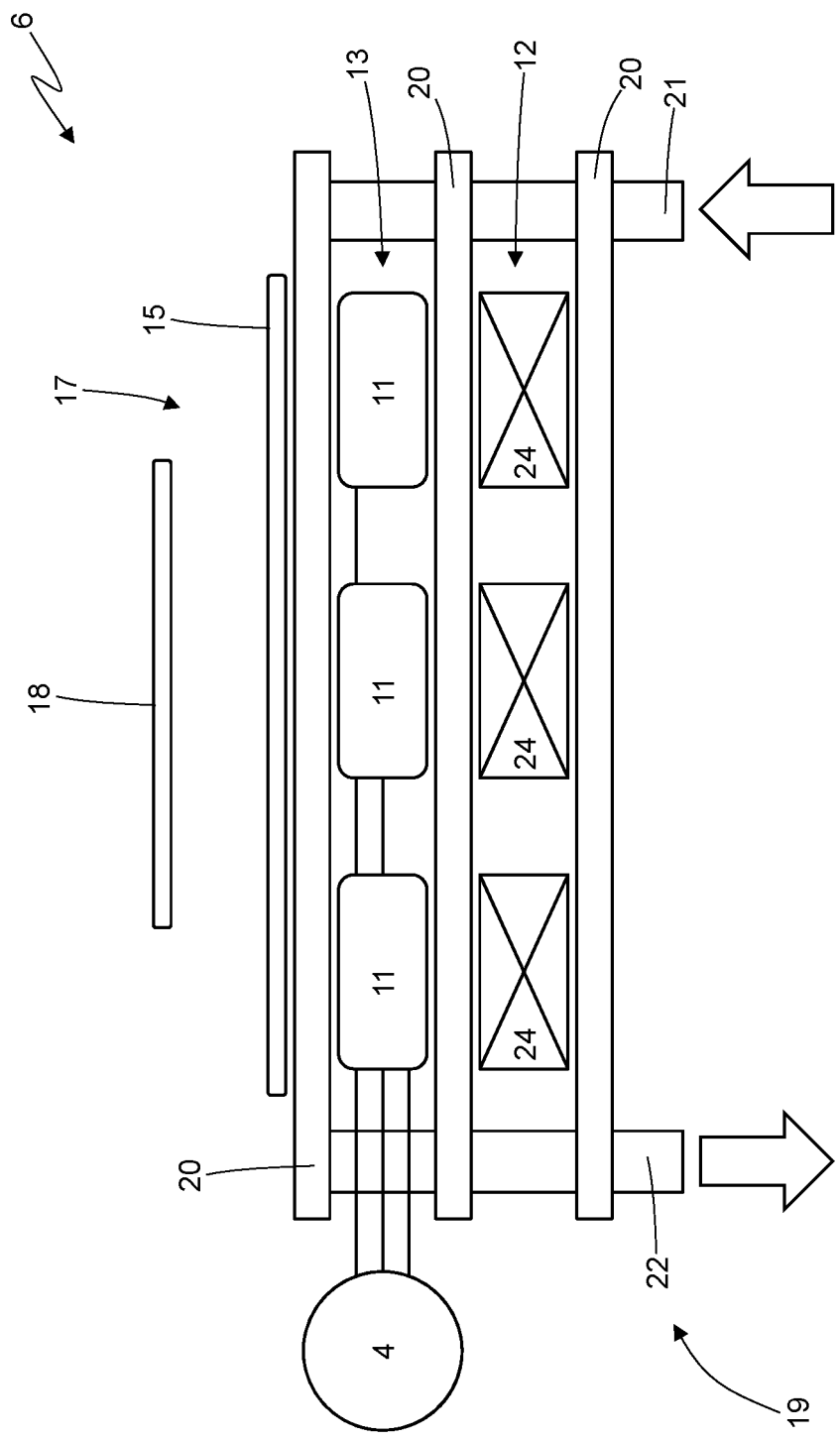
FIG. 9 is a schematic view of a variant of the electronic power converter of FIG. 3.

According to a possible embodiment shown in FIG. 9, an electronic power converter 6 can be "demoted" to power one single electric motor 4 with a single nominal power by eliminating the group 13 of power modules 11 (and, hence, the corresponding gate control device 16) and by replacing the three power modules 11 of the group 13 with the same number of empty casings 24 having the same outer dimensions (in order not to change the size and the conformation of the pile 17). This solution allows the electronic power converter 6 to be used to also power one single electric motor 4 with a single nominal power, for example when the electric motor 4 with a single nominal power is connected to an axle by means of a differential or when the electric motor 4 with a single nominal power is connected to a drive shaft of an internal combustion engine.

Alternatively, the electronic power converter 6 only comprises the group 12 of power modules 11 and there are neither the group 13 of power modules 11 nor the central plate 20; namely, there are only the two lateral plates 20 arranged at the two opposite ends of the single group of power modules 11.

Figure 10:
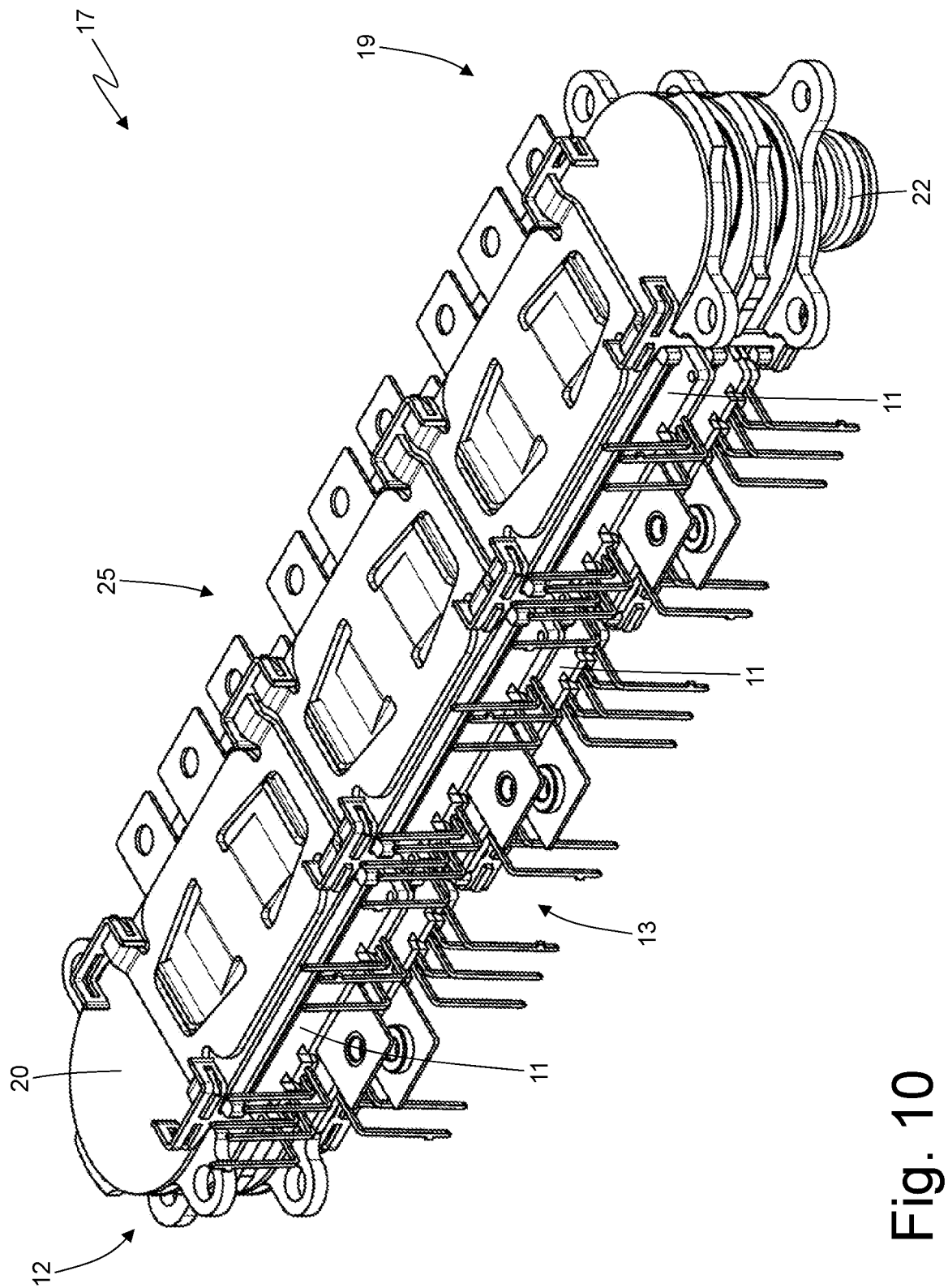
FIGS. 10 and 11 are two different perspective views of pile of components of the electronic power converter of FIG. 3.

According to FIGS. 10 and 11, in each electronic power converter 6, the pile 17 consists of the two groups 12 and 13 of power modules 11 and of the three plates 20 of the cooling system 19 and is provided with a clamping system 25, which applies a clamping force to the pile 17 in order to keep the pile 17 compressed (and, hence, also hold the pile 17 together); it should be pointed out that the clamping force applied by the clamping system 25 to the pile 17 must be capable of resisting, without undesired movements, to the force of hydraulic origin generated by the circulation of the cooling liquid under pressure.

Figure 15:
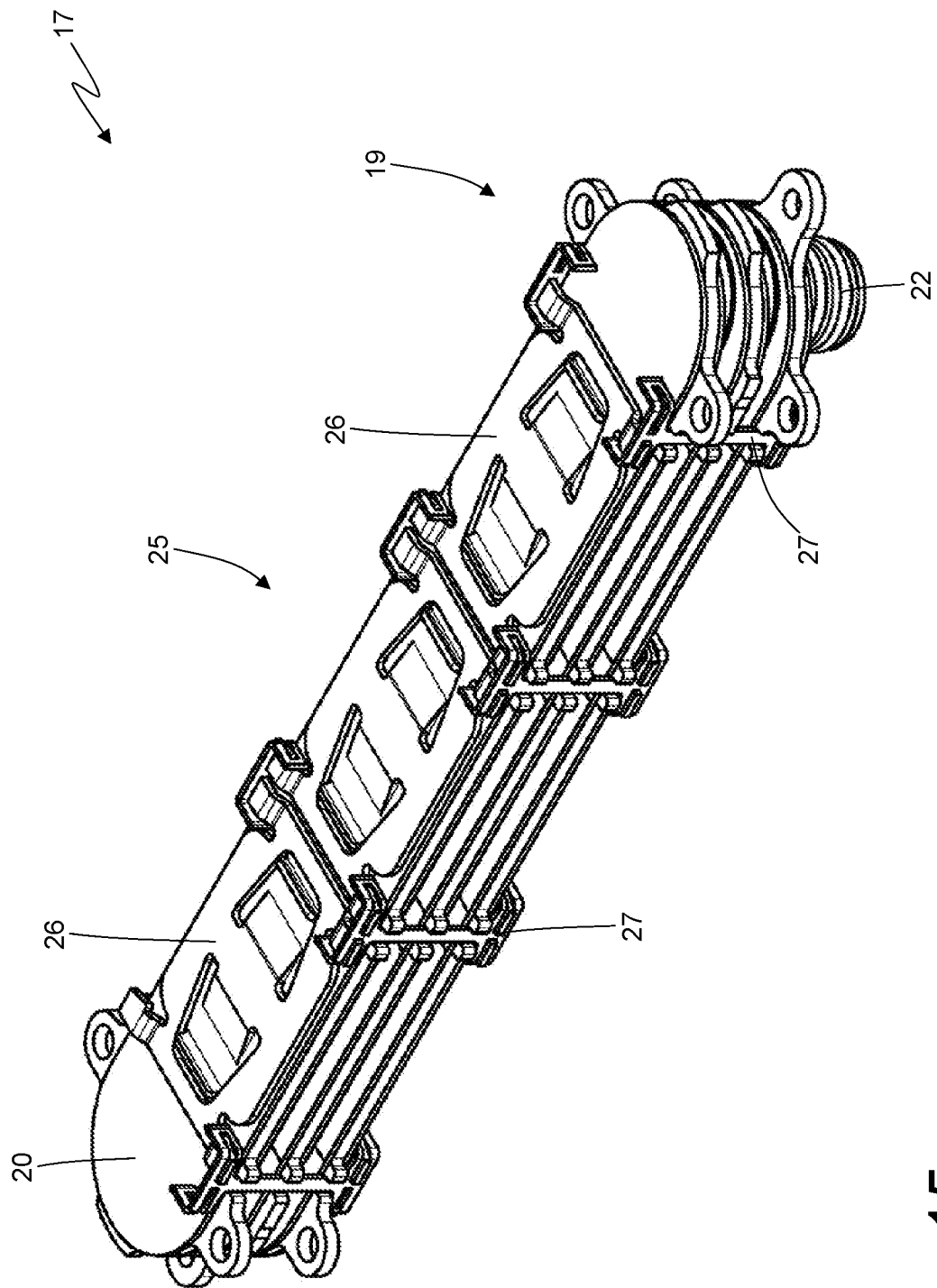
FIG. 15 is a perspective view of the pile of components of FIGS. 10 and 11 highlighting a clamping system.
Figure 16:
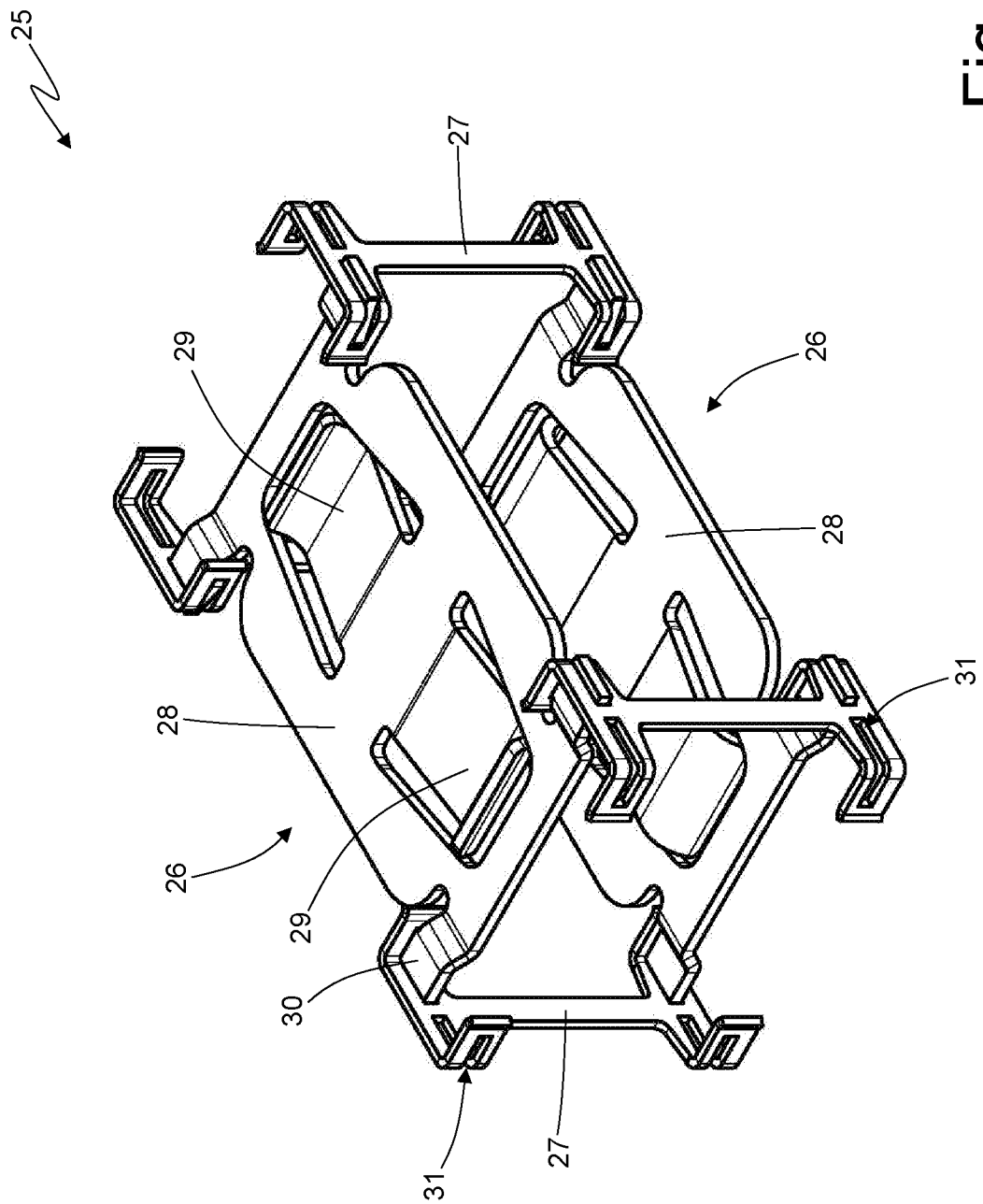
FIGS. 16 and 17 are two different perspective views of part of the clamping system of FIG. 15.
Figure 17:
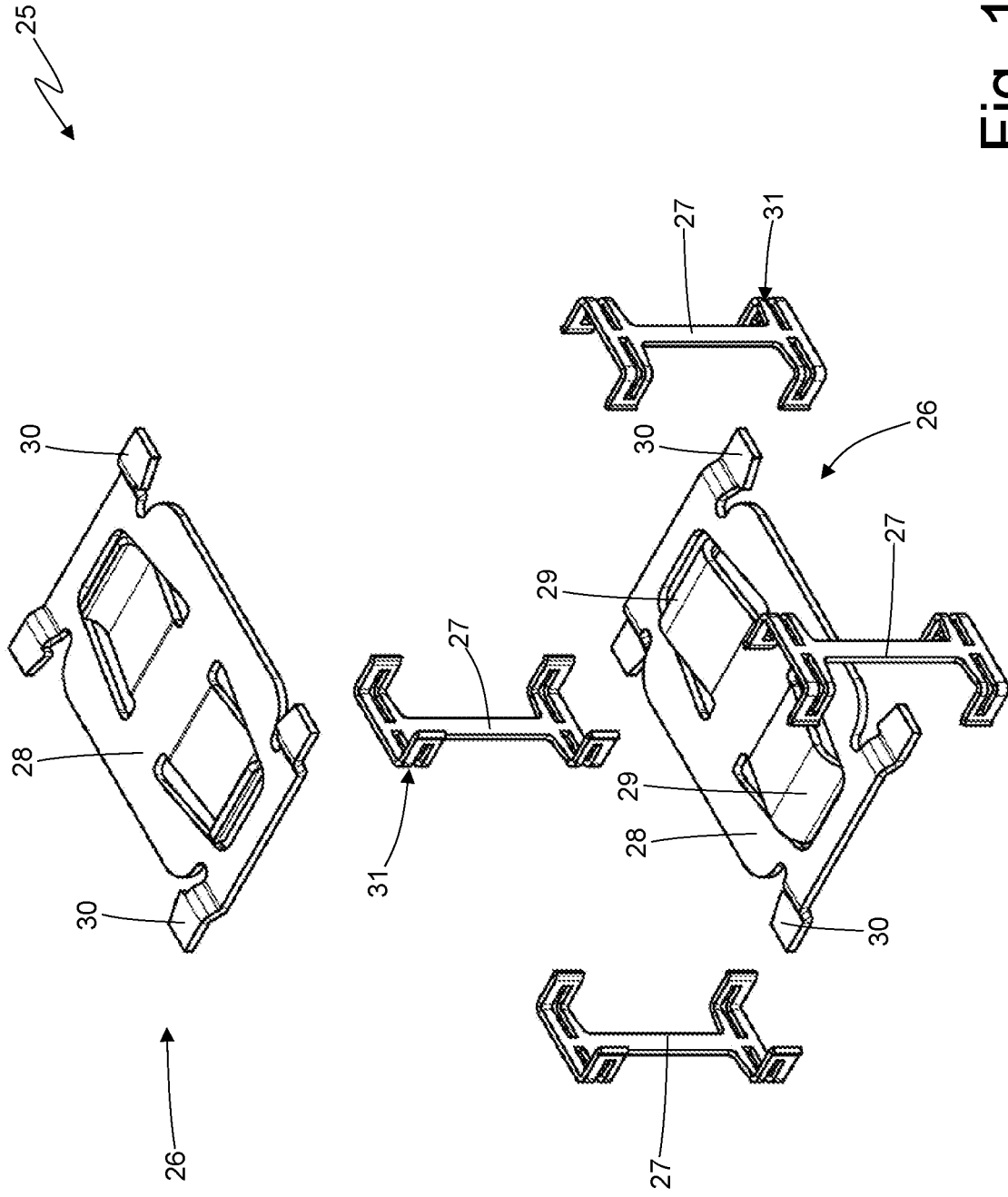

According to the embodiment better shown in FIGS. 15, 16 and 17, the clamping system 25 comprises elastic elements 26, which are deformed in order to apply a compression force of elastic origin to the pile 17; namely, the elastic elements 26 press against two opposite outer walls of the lateral plates 20 in order to apply a clamping force of elastic origin to the pile 17 so as to keep the pile 17 compressed. In particular, three pairs of elastic elements 26 are provided (one pair of elastic elements 26 for each power module 11 making up the group 12 or the group 13) and, in each pair of elastic elements 26, the two elastic elements 26 rest against two outer walls of the lateral plates 20 so as to clamp the pile 17 between them in a "sandwich"-like manner. The clamping system 25 comprises two tie rods 27, which apply a traction between two opposite elastic elements 26 (this traction presses the opposite elastic elements 26 against the opposite outer walls of the lateral plates 20 and determines the elastic deformation of the opposite elastic elements 26).

Each elastic element 26 has a frame 28 (with a substantially rectangular shape) and at least one pressing member 29, which is hinged to the frame 28, projects from the frame 28 towards an outer wall of a lateral plate 20 lying underneath and is elastically deformed by being pressed against the outer wall of a lateral plate 20 lying underneath. Each elastic element 26 preferably has two pressing members 29 arranged next to one another and opposite one another, namely oriented in an opposite manner relative to one another.

Furthermore, each elastic element 26 has four appendages 30, which project from the frame 28 at the four corners of the frame 28; furthermore, each tie rod 27 has at least one slit 31, which is engaged by an appendage 30 of a corresponding elastic element 26. Preferably, in each elastic element 26, the appendages 30 are parallel and non-coplanar to the frame 28 (namely, are arranged higher than the frame 28) and are connected to the frame 28 by means of respective inclined planes. The tie rods 27 arranged in the central area of the pile 17 are shared by two elastic elements 26 next to one another; furthermore, all tie rods 27 are arranged next to the power modules 11, namely in the free space beside the power modules 11.

In other words, in each clamping system 25, the tie rods 27 are arranged next to the power modules 11, namely half the tie rods 27 are arranged on one side of the pile 17 and the other half of the tie rods 27 are arranged on the other side of the pile 17; in particular, the tie rods 27 are each arranged next to at least one power module 11, namely the tie rods 27 are arranged in the areas where there are no power modules 11. In the embodiment shown in the accompanying figures, each clamping system 25 totally comprises eight tie rods 27 arranged four on one side of the pile 17 and four on the other side of the pile 17.

In each elastic element 26, the frame 28 consists of a flat plate, from which the two pressing members 29 (opposite and next to one another) project in a direction and from which the four appendages 30 project in an opposite direction. In particular, in each elastic element 26, each pressing member 29 forms an obtuse angle with the frame 28 and is "L"-shaped with a rounded corner.

The clamping system 25 described above offers many advantages for it has a small weight (smaller than a traditional clamping system using screws and bolts) combined with a particularly small transverse dimension (significantly smaller than a traditional clamping system using screws and bolts). Furthermore, the clamping system 25 described above automatically compensates (namely, without any type of intervention) for manufacturing tolerances in the total thickness of the pile 17, always and anyway applying a constant and predetermined clamping force.

The embodiments described herein can be combined with one another, without for this reason going beyond the scope of protection of the invention.

Figure 18:
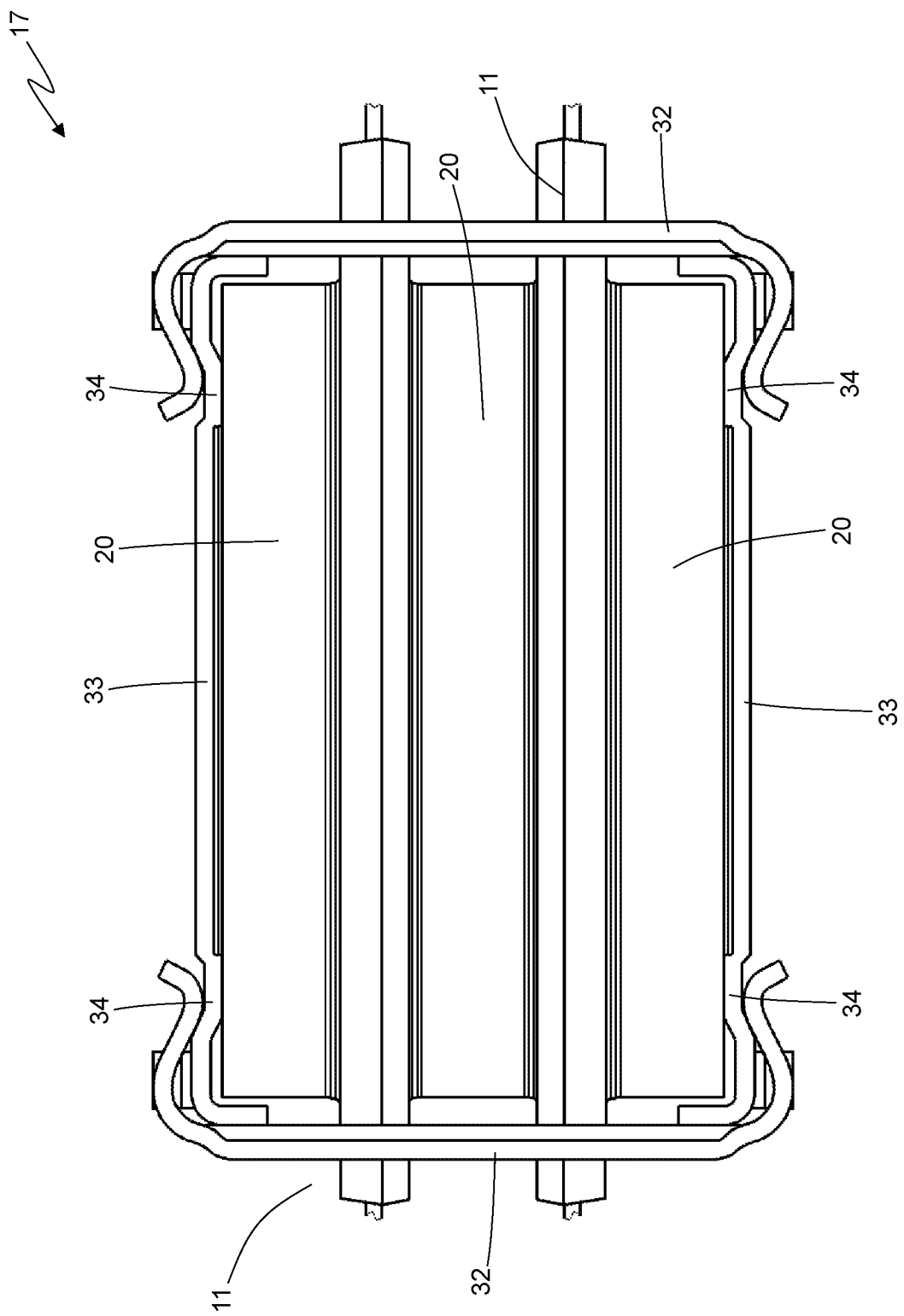
FIG. 18 is a cross section view of the pile of components of FIGS. 10 and 11 provided with an alternative embodiment of the clamping system, which is not part of the invention.

In the example shown in FIG. 18, which is not part of the invention, each clamping system 25 comprises a plurality of elastic elements 32 consisting of "C"-shaped springs made of steel, each pressing on the two lateral plates 20 to push the two lateral plates 20 towards one another with a predetermined elastic force.

In the example shown in FIG. 18, which is not part of the invention, in each clamping system 25, the elastic elements 32 (namely, the springs 32) are arranged next to the power modules 11, namely half the elastic elements 32 are arranged on one side of the pile 17 and the other half of the elastic elements 32 are arranged on the other side of the pile 17; in particular, the elastic elements 32 (namely, the springs) are each arranged next to at least one power module 11, namely the elastic elements 32 are arranged in the areas where there are no power modules 11.

In the embodiment shown in FIG. 18, which is not part of the invention, each clamping system 25 totally comprises eight elastic elements 32 (springs) arranged four on one side of the pile 17 and four on the other side of the pile 17.

In the example shown in FIG. 18, which is not part of the invention, each clamping system 25 comprises two coupling elements 33, each having an inner surface, which directly rests against a corresponding lateral plate 20, and an outer surface (opposite the inner surface), against which the ends of the corresponding elastic elements 32 (springs) directly rest. In other words, the two coupling elements 33 are arranged at the opposite ends of the pile 17 in order to hold the pile 17 together. The function of the coupling elements 33 is that of properly distributing the clamping force applied by the elastic elements 32, preventing the ends of the elastic elements 32 from directly stressing the lateral plates 20.

In the example shown in FIG. 18, which is not part of the invention, each coupling element 33 consists of pressed sheet metal, namely consists of a sheet of metal material, which is shaped through pressing.

In the example shown in FIG. 18, which is not part of the invention, each coupling element 33 has a succession of identical structures (namely, a repetition of identical structures), each located in the area of a corresponding power module 11; namely, each coupling element 33 has a number of identical structures that is the same as the number of power modules 11 making up each group 12 or 13 (hence, three identical structures in the embodiment shown in the accompanying figures).

In the example shown in FIG. 18, which is not part of the invention, each structure has four appendages 34, on which the ends of the corresponding elastic elements 32 rest, and is configured to apply the elastic force generated by the corresponding elastic elements 32 in a central area of the structure; two adjacent structures share the same appendages 34, which are common for the two adjacent structures. Each structure has an approximately rectangular outline and the four appendages 34 project from the approximately rectangular outline.

In the example shown in FIG. 18, which is not part of the invention, each structure has two through openings arranged on the opposite sides of the central area of the structure; the two through openings give the structure a cross-like shape, which allows the clamping force applied by the elastic elements 32 to be directed towards the central area of the lateral plates 20.

In the example shown in FIG. 18, which is not part of the invention, each structure has a lowering, preferably with a circular shape, coinciding with the central area of the structure; the lowering helps concentrate the clamping force applied by the elastic elements 32 in the central area of the lateral plates 20.

The electronic power converter 6 described above has numerous advantages.

First of all, the electronic power converter 6 described above has a significant use flexibility, since, preserving the same hardware structure, it can indifferently power (obviously, with suitable software adjustments) one single electric motor 4 with a double nominal power, one single electric motor 4 with a single nominal power or two electric motors 4 with a double nominal power.

Furthermore, the electronic power converter 6 described above has an arrangement that optimizes the cooling of all those components which, in use, generate a lot of heat (mainly, the six power modules 11), namely it cools the six power modules 11 in an effective manner (ensuring that their work temperature never is too high) and, at the same time, also in an efficient manner (namely, using a reduced cooling liquid flow rate).

The electronic power converter 6 described above is particularly compact thanks to the particular arrangement of the six power modules 11 alternated with the three plates 20 of the cooling system 19.

Finally, the electronic power converter 6 described above ensures relatively low costs as well as a relatively small manufacturing complexity.

LIST OF THE REFERENCE NUMBERS OF THE FIGURES 1 vehicle
1 vehicle
2 wheels
3 powertrain system
4 electric motor
5 drivetrain
6 electronic power converter
7 power storage system
8 high-voltage electric system
9 container
10 container
11 power modules
12 group
13 group
14 transistor
15 gate control device
16 gate control device
17 pile
18 control unit
19 cooling system
20 plate
21 delivery pipe
22 return pipe
23 capacitor
24 empty casings
25 clamping system
26 elastic elements
27 tie rods
28 frame
29 pressing member
30 appendages
31 slits
32 springs
33 coupling elements
34 appendages

The invention claimed is:

1. An electronic power converter (6) to control at least one electric motor (4) of a vehicle (1); the electronic power converter (6) comprises:
   a first group (12) of three power modules (11), each designed to power with an alternating current one single phase of the electric motor (4);
   a second group (13) of power modules (11), each designed to power with an alternating current one single phase of the electric motor (4);
   a central plate (20), which is arranged between the first group (12) and the second group (13);
   two lateral plates (20), which are arranged on opposite sides of the first group (12) and of the second group (13) so as to form a pile (17) together with the first group (12) and the second group (13);
   a hydraulic circuit, which is configured to cause a cooling liquid to circulate inside the plates (20); and
   a clamping system (25) comprising at least two elastic elements (26), which press against two opposite outer walls of the lateral plates (20) so as to apply a clamping force of elastic origin to the pile (17) in order to keep the pile (17) compressed;
   wherein each elastic element (26) has a frame (28) and at least one pressing member (29), which is hinged to the frame (28), projects from the frame (28) towards a corresponding outer wall of a lateral plate (20) and is elastically deformed by being pressed against the corresponding outer wall of a lateral plate (20); and
   wherein the clamping system (25) comprises at least two tie rods (27), which connect the frames (28) of the two elastic elements (26) to one another in order to pull the frames (28) towards one another, hence applying a traction between the frames (28).

2. The electronic power converter (6) according to claim 1, wherein each elastic element (26) has two pressing members (29) arranged next to and opposite one another.

3. The electronic power converter (6) according to claim 1, wherein:
the frame (28) of each elastic element (26) has at least two appendages (30), which project from the frame (28); and
each tie rod (27) has at least one slit (31), which is engaged by an appendage (30) of a corresponding elastic element (26).

4. The electronic power converter (6) according to claim 3, wherein, in each elastic element (26), the frame (28) consists of a flat plate, from which the pressing member (29) projects in a direction and from which the appendages (30) project in an opposite direction.

5. The electronic power converter (6) according to claim 3, wherein:
four tie rods (27) are provided; and
the frame (28) of each element has a substantially rectangular shape and has four appendages (30), which project from frame (28) at the four corners of the frame (28).

6. The electronic power converter (6) according to claim 3, wherein, in each elastic element (26), the appendages (30) are parallel and non-coplanar to the frame (28) and are connected to the frame (28) by means of respective inclined planes.

7. The electronic power converter (6) according to claim 1, wherein for each power module (11) of the first group (12) there are provided a pair of opposite elastic elements (26).

8. The electronic power converter (6) according to claim 7, wherein some tie rods (27) are shared by two elastic elements (26) next to one another.

9. The electronic power converter (6) according to claim 1, wherein the tie rods (27) are arranged next to the power modules (11).

10. The electronic power converter (6) according to claim 1, wherein, in each elastic element (26), the pressing member (29) forms an obtuse angle with the frame (28).

11. The electronic power converter (6) according to claim 1, wherein, in each elastic element (26), the pressing member (29) is "L"-shaped with a rounded corner.

12. The electronic power converter (6) according to claim 1, wherein, in each elastic element (26), the frame (28) consists of a flat plate, from which the pressing member (29) projects.

13. The electronic power converter (6) according to claim 1, wherein:
the power modules (11) of the first group (12) are arranged next to one another on a same first plane; and
the power modules (11) of the second group (13) which are arranged next to one another on a same second plane, which is parallel to and separate from the first plane.

14. The electronic power converter 6) according to claim 1, wherein the hydraulic circuit comprises a delivery pipe (21), which is oriented perpendicularly to the plates (20) and goes through at least one plate (20) from side to side, and a return pipe (22), which is oriented perpendicularly to the plates (20) and goes through at least one plate (20) from side to side.

15. An electronic power converter (6) to control at least one electric motor (4) of a vehicle (1); the electronic power converter (6) comprises:
at least one first group (12) of three power modules (11), each designed to power with an alternating current one single phase of the electric motor (4);
two lateral plates (20), which are arranged on opposite sides of the first group (12) so as to form a pile (17) together with the first group (12);
a hydraulic circuit, which is configured to cause a cooling liquid to circulate inside the plates (20); and
a clamping system (25) comprising at least two elastic elements (26), which press against two opposite outer walls of the lateral plates (20) so as to apply a clamping force of elastic origin to the pile (17) in order to keep the pile (17) compressed;
wherein each elastic element (26) has a frame (28) and at least one pressing member (29), which is hinged to the frame (28), projects from the frame (28) towards a corresponding outer wall of a lateral plate (20) and is elastically deformed by being pressed against the corresponding outer wall of a lateral plate (20);
wherein the clamping system (25) comprises at least two tie rods (27), which connect the frames (28) of the two elastic elements (26) to one another in order to pull the frames (28) towards one another, hence applying a traction between the frames (28);
wherein the frame (28) of each elastic element (26) has at least two appendages (30), which project from the frame (28); and
wherein each tie rod (27) has at least one slit (31), which is engaged by an appendage (30) of a corresponding elastic element (26).

16. The electronic power converter (6) according to claim 15, wherein, in each elastic element (26), the frame (28) consists of a flat plate, from which the pressing member (29) projects in a direction and from which the appendages (30) project in an opposite direction.

17. The electronic power converter (6) according to claim 15, wherein:
four tie rods (27) are provided; and
the frame (28) of each element has a substantially rectangular shape and has four appendages (30), which project from frame (28) at the four corners of the frame (28).

18. The electronic power converter (6) according to claim 15, wherein, in each elastic element (26), the appendages (30) are parallel and non-coplanar to the frame (28) and are connected to the frame (28) by means of respective inclined planes.

19. An electronic power converter (6) to control at least one electric motor (4) of a vehicle (1); the electronic power converter (6) comprises:
at least one first group (12) of three power modules (11), each designed to power with an alternating current one single phase of the electric motor (4);
two lateral plates (20), which are arranged on opposite sides of the first group (12) so as to form a pile (17) together with the first group (12);
a hydraulic circuit, which is configured to cause a cooling liquid to circulate inside the plates (20); and
a clamping system (25) comprising at least two elastic elements (26), which press against two opposite outer walls of the lateral plates (20) so as to apply a clamping force of elastic origin to the pile (17) in order to keep the pile (17) compressed;
wherein each elastic element (26) has a frame (28) and at least one pressing member (29), which is hinged to the frame (28), projects from the frame (28) towards a corresponding outer wall of a lateral plate (20) and is elastically deformed by being pressed against the corresponding outer wall of a lateral plate (20);

wherein the clamping system (25) comprises at least two tie rods (27), which connect the frames (28) of the two elastic elements (26) to one another in order to pull the frames (28) towards one another, hence applying a traction between the frames (28); and wherein, in each elastic element (26), the pressing member (29) is "L"-shaped with a rounded corner.

* * * * *